United States Patent
Lee et al.

(10) Patent No.: US 8,350,235 B2
(45) Date of Patent: Jan. 8, 2013

(54) SEMICONDUCTOR INTRA-FIELD DOSE CORRECTION

(75) Inventors: Hyung-Rae Lee, Kyunggi-do (KR); Dong Hee Yu, Kyunggi-do (KR); Sohan Singh Mehta, Beacon, NY (US); Niall Shepherd, Lagrangeville, NY (US); Daniel A Corliss, Hopewell Junction, NY (US)

(73) Assignees: Freescale Semiconductor, Austin, TX (US); International Business Machines Corporation, Armonk, NY (US); Samsung Electronics Co., Ltd., Suwon-Si (KR); Globalfoundries Singapore Pte., Ltd., Singapore (SG)

( * ) Notice: Subject to any disclaimer, the term of this patent is extended or adjusted under 35 U.S.C. 154(b) by 680 days.

(21) Appl. No.: 12/509,821

(22) Filed: Jul. 27, 2009

(65) Prior Publication Data

US 2011/0017926 A1    Jan. 27, 2011

(51) Int. Cl.
*G21K 5/10* (2006.01)

(52) U.S. Cl. ............. 250/492.1; 250/492.2; 250/492.22; 250/492.3

(58) Field of Classification Search ..... 250/492.1–492.3
See application file for complete search history.

(56) References Cited

U.S. PATENT DOCUMENTS

| | | | |
|---|---|---|---|
| 6,346,979 B1 * | 2/2002 | Ausschnitt et al. | 355/53 |
| 2009/0032739 A1 * | 2/2009 | Kawase | 250/492.23 |
| 2009/0101816 A1 * | 4/2009 | Noji et al. | 250/310 |
| 2009/0114853 A1 * | 5/2009 | Fujii et al. | 250/492.21 |

* cited by examiner

*Primary Examiner* — Michael Maskell
(74) *Attorney, Agent, or Firm* — F. Chau & Associates, LLC

(57) ABSTRACT

A system and method are provided for automatic dose-correction recipe generation, the system including a dose-correction recipe generator, a reticle data unit in signal communication with the recipe generator, a slit data unit in signal communication with the recipe generator, a process data unit in signal communication with the recipe generator, a wafer data unit in signal communication with the recipe generator, a control unit in signal communication with the recipe generator, and an output unit or a storage unit in signal communication with the control unit; and the method including receiving a current reticle data set and a previous reticle data set, receiving a current slit data set and a previous slit data set, receiving a process condition, receiving a wafer condition, automatically generating a dose-correction recipe in accordance with the received reticle, slit, process and wafer information, and controlling a dose in accordance with the generated recipe.

15 Claims, 6 Drawing Sheets

SEMICONDUCTOR INTRA-FIELD DOSE CORRECTION

BACKGROUND OF THE INVENTION

The present disclosure generally relates to semiconductor manufacturing and lithography methods. More particularly, the present disclosure relates to methods for intra-field dose mapping and correction in semiconductor devices.

SUMMARY OF THE INVENTION

The present disclosure teaches an automatic dose-correction recipe generation system for adaptation of a semiconductor intra-field (e.g., chip or die) dose correction map to new photolithography masks. Exemplary embodiments are provided.

An exemplary embodiment automatic dose-correction recipe generation system comprises: a dose-correction recipe generator; at least one reticle data unit in signal communication with the recipe generator; at least one slit data unit in signal communication with the recipe generator; a process data unit in signal communication with the recipe generator; a wafer data unit in signal communication with the recipe generator; a control unit in signal communication with the recipe generator; and at least one of an output unit or a storage unit in signal communication with the control unit.

A further embodiment sets forth that the reticle data unit subtracts current reticle data from previous reticle data. A further embodiment sets forth that the current reticle data corresponds to a current mask and the previous reticle data corresponds to a previous mask.

A further embodiment sets forth that the slit data unit subtracts current slit data from previous slit data. A further embodiment sets forth that the current slit data corresponds to a current condition of a slit and the previous slit data corresponds to a previous condition of the slit.

A further embodiment sets forth that the process unit includes at least one of resist conditions, process conditions, or mask error enhancement factor conditions. A further embodiment sets forth that the wafer unit includes wafer conditions and topography information. A further embodiment sets forth that the control unit includes twenty-nine fingers. A further embodiment sets forth that the output unit is indicative of detected critical dimension uniformity. A further embodiment provides a sub-recipe unit for generating a sub-recipe for each combination of reticle and scanner data.

An exemplary embodiment method for automatic dose-correction recipe generation comprises: receiving at least one current reticle data set and at least one previous reticle data set; receiving at least one current slit data set and at least one previous slit data set; receiving at least one process condition; receiving at least one wafer condition; automatically generating a dose-correction recipe in accordance with the received reticle, slit, process and wafer information; and controlling a dose in accordance with the generated recipe.

A further embodiment includes subtracting current reticle data from previous reticle data. A further embodiment sets forth that the current reticle data corresponds to a current mask and the previous reticle data corresponds to a previous mask.

A further embodiment includes subtracting current slit data from previous slit data. A further embodiment sets forth that the current slit data corresponds to a current condition of a slit and the previous slit data corresponds to a previous condition of the slit.

A further embodiment sets forth that the process conditions include at least one of resist conditions, process conditions, or mask error enhancement factor conditions. A further embodiment sets forth that the wafer conditions include wafer topography information. A further embodiment includes at least one of storing or outputting information indicative of detected critical dimension uniformity. A further embodiment includes generating a sub-recipe for each combination of reticle and scanner data.

A further embodiment sets forth a computer-readable storage medium tangibly embodying a program of instructions executable by a computer to perform program steps for automatic dose-correction recipe generation, the program steps comprising: receiving at least one current reticle data set and at least one previous reticle data set; receiving at least one current slit data set and at least one previous slit data set; receiving at least one process condition; receiving at least one wafer condition; automatically generating a dose-correction recipe in accordance with the received reticle, slit, process and wafer information; and controlling a dose in accordance with the generated recipe.

The present disclosure will be further understood from the following description of exemplary embodiments, which is to be read in connection with the accompanying drawings.

BRIEF DESCRIPTION OF THE DRAWINGS

The present disclosure provides a method for adapting a semiconductor intra-field dose correction map from a first photolithography mask to a second photolithography mask in accordance with the following exemplary figures, in which.

DETAILED DESCRIPTION OF PREFERRED EMBODIMENTS

An automatic dose correction recipe generation system is provided for improving intra-field critical dimension (CD) uniformity. The recipe generation system is applicable to lithography, dose correction, dose mapping and slit uniformity.

Dose correction methods have been used to improve constrained minimum variance (CMV). In-field or intra-field CD uniformity relates to single chip or die uniformity. Much of the non-uniformity comes from mask error and/or deteriorated scanner slit conditions. Unfortunately, previous dose correction methods did not use mask data and/or slit uniformity information from a scanner.

An exemplary automatic dose correction recipe generation system is provided to compensate for the non-uniformity resulting from mask processes and exposure processes on a scanner. Mask data is sent when a mask is delivered. Slit uniformity is monitored regularly, such as bi-weekly or weekly. A Mask Error enhancement Factor (MEF) is used to correct the mask process error on a wafer.

Figure 1:
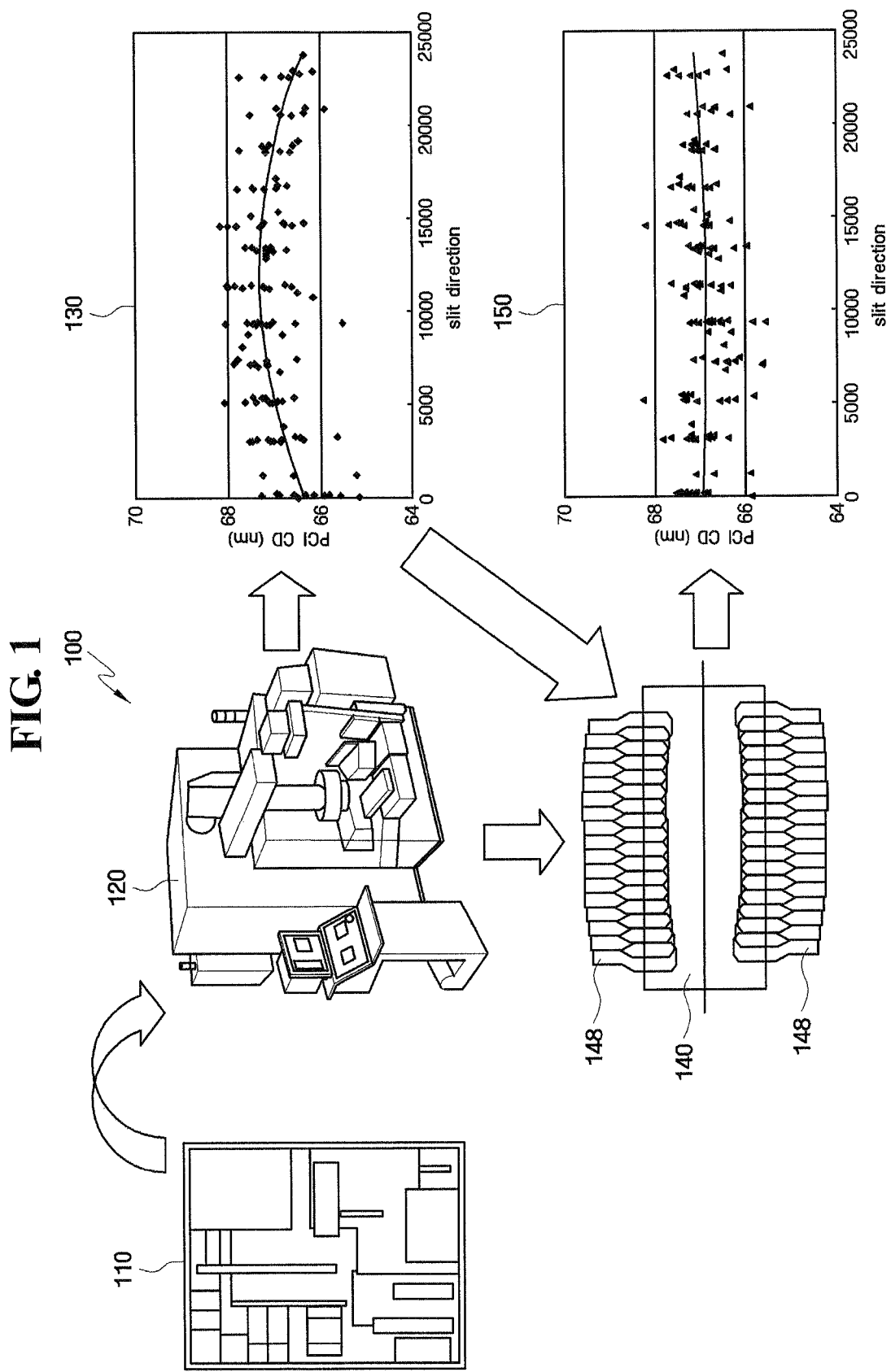
FIG. 1 shows a schematic block diagram of a method for intra-field dose correction.

As shown in FIG. 1, a method for intra-field dose correction is indicated generally by the reference numeral 100. Here, a reticle unit 110 passes reticle information to an exposure tool 120. The exposure tool passes exposure information to a detected critical dimension (DCD) unit 130 for measuring CD uniformity in the slit direction, without dose correction. In addition, the exposure tool 120 passes exposure information to a control unit 140, which has 29-finger portions 148. Moreover, the DCD unit 130 passes a sub-recipe to the control unit 140. The control unit, in turn, passes information to a DCD unit 150, which exhibits improved uniformity with dose correction. Unfortunately, this method requires a great deal of data. Notably, the method uses no mask information, no scanner information, and no wafer information.

When a new mask is reordered without any change, this method requires setup of another dose correction recipe for the new mask, which may take up to four additional weeks. In addition, the recipe requires another set of wafer CD data, regardless of mask CD data and scanner condition.

Figure 2:
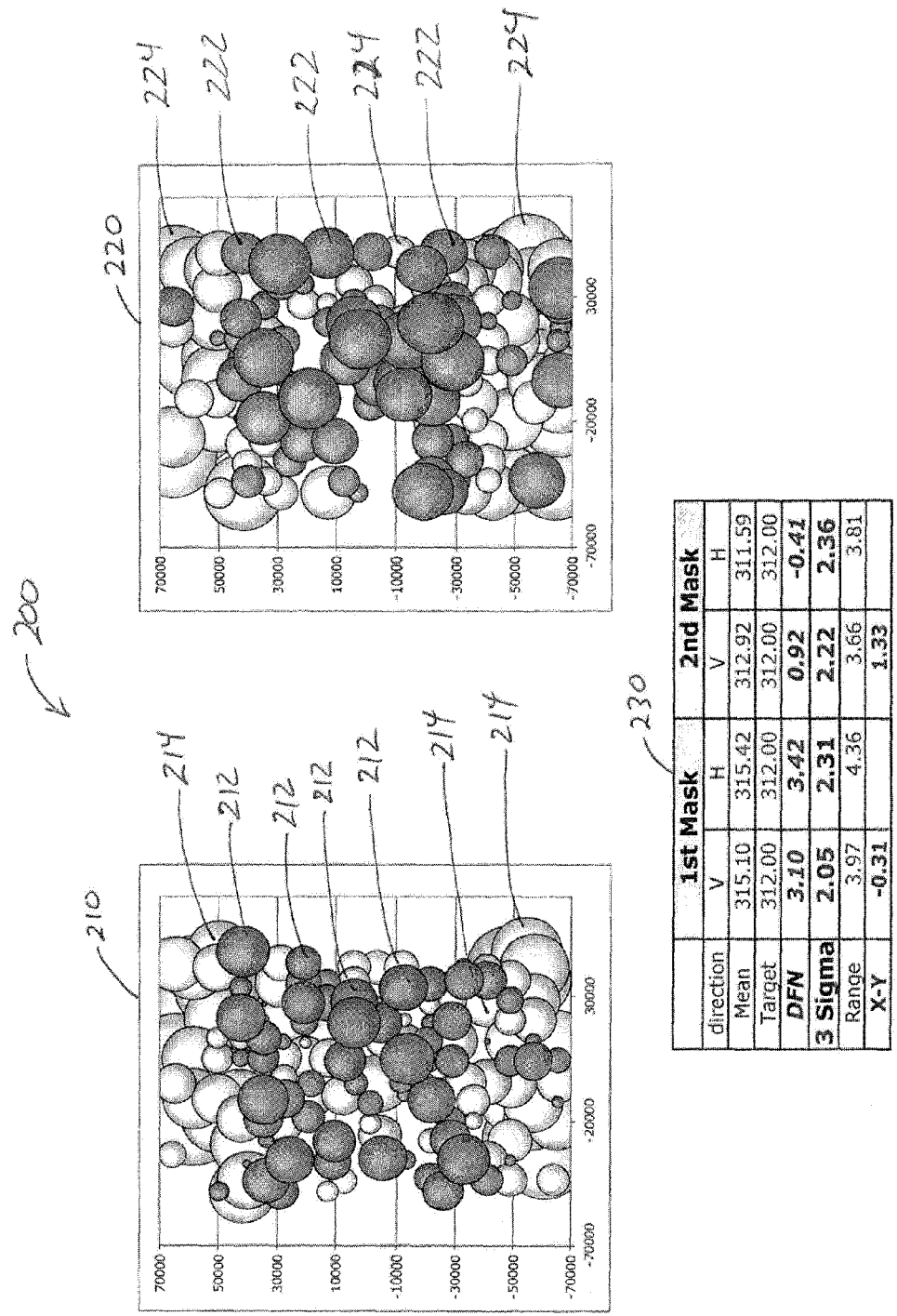
FIG. 2 shows a schematic graphical diagram of mask uniformity.

Turning to FIG. 2, plots of mask uniformity are indicated generally by the reference numeral 200, with units in nanometers. A first intra-field CD uniformity map 210 shows intra-field uniformity for a wafer with a first mask, and a second intra-field CD uniformity map 220 shows intra-field uniformity for a wafer with a second mask. The first mask map 210 includes areas 212 having CDs greater than a mean CD value, and areas 214 having CDs smaller than a mean CD value. Similarly, the second mask map 220 includes areas 222 having CDs greater than a mean CD value, and areas 224 having CDs smaller than a mean CD value.

A table 230 indicates vertical and horizontal data resulting from the first and second masks. Here, the first mask yields a vertical mean of 315.10 nanometers, a vertical target of 312.00 nanometers, a vertical difference (DFN) of 3.10 nanometers, a vertical 3-sigma value of 2.05 nanometers, a vertical range of 3.97 nanometers, and an X-Y value of −0.31. The first mask yields a horizontal mean of 315.42 nanometers, a horizontal target of 312.00 nanometers, a horizontal DFN of 3.42 nanometers, a horizontal 3-sigma value of 2.31 nanometers, and a horizontal range of 4.36 nanometers.

In comparison, the second mask yields a vertical mean of 312.92 nanometers, a vertical target of 312.00 nanometers, a vertical DFN of 0.92 nanometers, a vertical 3-sigma value of 2.22 nanometers, a vertical range of 3.66 nanometers, and an X-Y of 1.33. The second mask yields a horizontal mean of 311.59 nanometers, a horizontal target of 312.00 nanometers, a horizontal DFN of −0.41 nanometers, a horizontal 3-sigma value of 2.36 nanometers, and a horizontal range of 3.81 nanometers.

Figure 3:
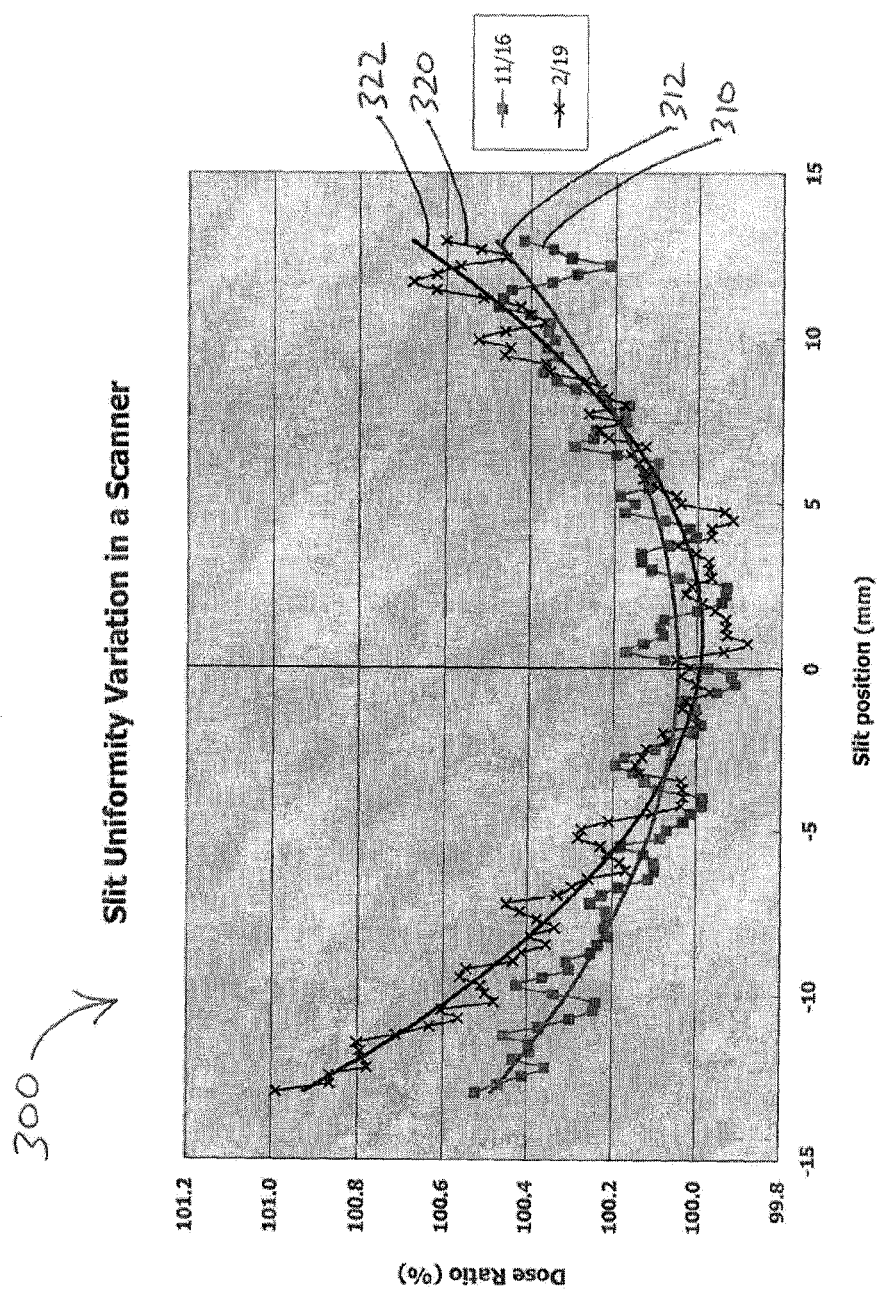
FIG. 3 shows a schematic graphical diagram of slit uniformity variation in a scanner.

Turning now to FIG. 3, a plot of slit uniformity variation in a scanner is indicated generally by the reference numeral 300. The plot 300 includes dose ratio percentage on the vertical axis, shown here in a range from 99.8% to 101.2%, and slit position in millimeters on the horizontal axis, shown here from −15 to +15 millimeters. Data 310 was collected on November 16$^{th}$, and follows a curve 312. Data 320 was collected about three months later on February 19$^{th}$, and follows a curve 322. As illustrated, slit variation that only reached about 100.5% in November, reached about 101.0% in February. Thus, scanner condition changes over time, and can also be affected by regular preventative maintenance (PM). It is much more difficult to improve CD uniformity without this slit uniformity information from the scanner.

Therefore, an improved method may use both mask CD and scanner condition to correct the mask CD non-uniformity. In this case, the mask CD may be delivered from a mask house. The scanner condition, which affects slit uniformity, may be measured with regular automatic monitoring. In addition, the mask error enhancement factor (MEF) may be measured during resist evaluation. A system embodiment of the present disclosure produces outputs from calculations using input data, such as reticle information, scanner information such as slit conditions, wafer information such as topography, and material information such as n and k values.

Each mask has a different CD distribution. Although wafer CD distribution data may be used to setup the dose correction recipe, the mask CD distribution data may be used instead. Directly using the mask data from a mask house for exposing wafers reduces the time required to set up the dose correction recipe.

Figure 4:
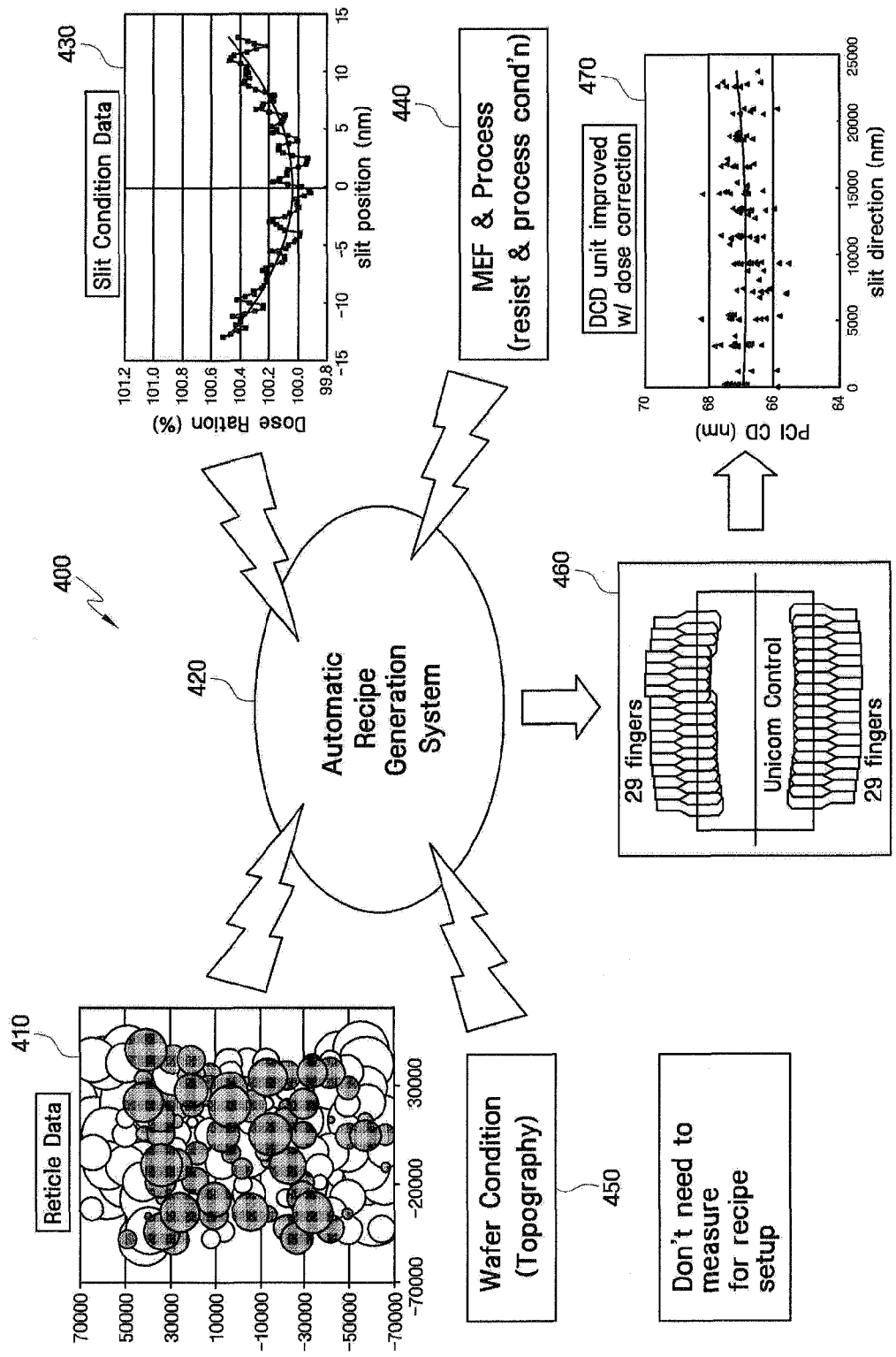
FIG. 4 shows a schematic block diagram of an automatic recipe generation system for intra-field dose correction in accordance with an exemplary embodiment of the present disclosure.

As shown in FIG. 4, an exemplary embodiment automatic recipe generation system for intra-field dose correction is indicated generally by the reference numeral 400. The system 400 includes a reticle data unit 410 connected to an automatic recipe generation system unit 420. A slit condition data unit 430 is connected to the automatic recipe generation system unit 420. An MEF and process unit 440, which tracks resist and process conditions, is also connected to the automatic recipe generation system unit 420. In addition, a wafer condition unit 450, which maintains topography information, is further connected to the automatic recipe generation system unit 420. The automatic recipe generation system unit 420, in turn, is connected to a control unit 460, such as a 29-finger unit. The control unit 460 is connected to an output unit 470, which indicates here that DCD uniformity is improved using this method of dose correction. Moreover, there is no need to take new measurements for recipe setup using this automatic recipe generation system for intra-field dose correction.

Figure 5:
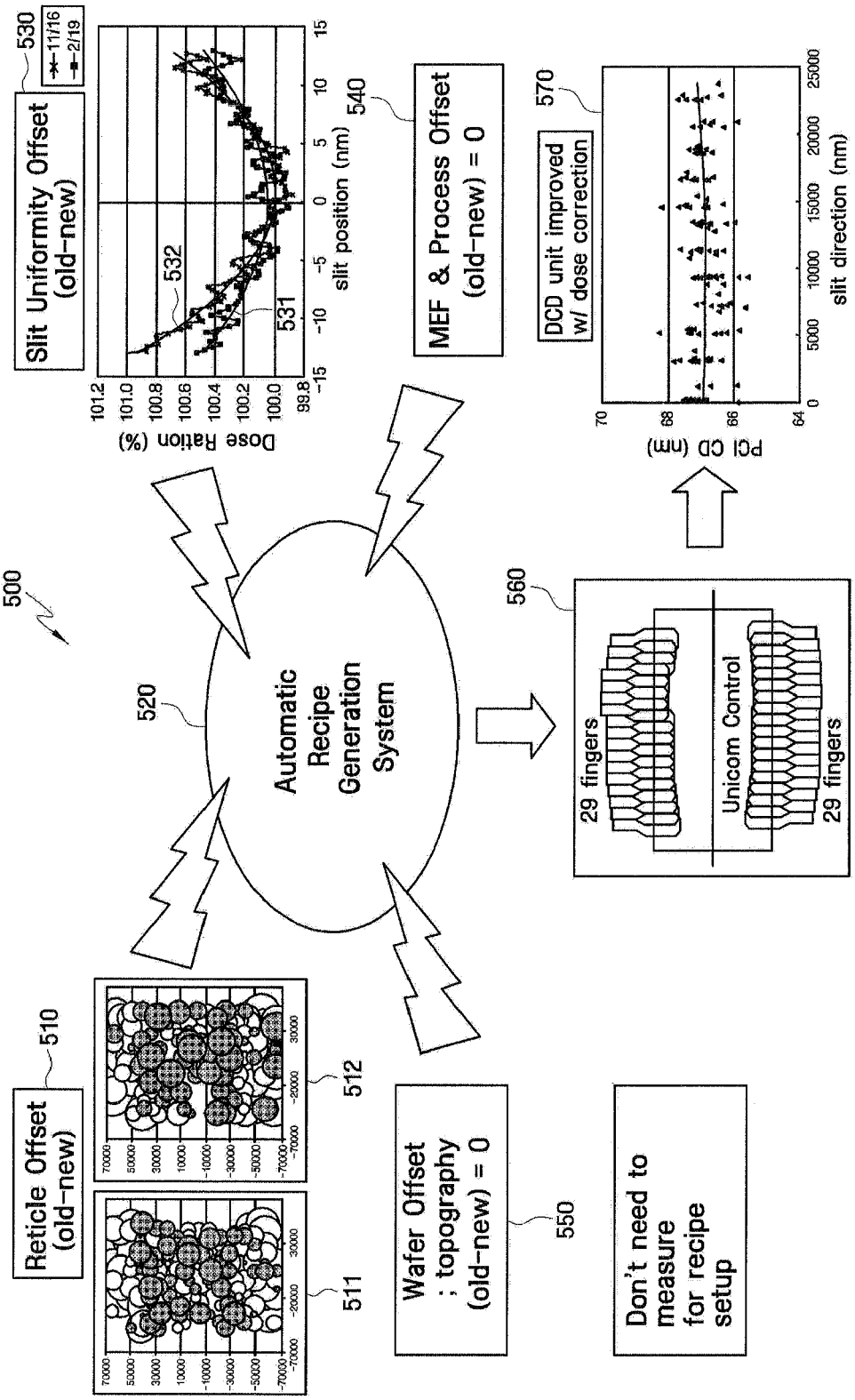
FIG. 5 shows a schematic block diagram of an automatic recipe generation system, adapted to the case where a new mask is re-ordered without any change, in accordance with an exemplary embodiment of the present disclosure.

Turning to FIG. 5, an automatic recipe generation system, adapted to the case where a new mask is reordered without any change, is indicated generally by the reference numeral 500. The system 500 includes a reticle offset data unit 510 connected to an automatic recipe generation system unit 520, where the reticle offset data unit subtracts new reticle data 512 from old reticle data 511. A slit uniformity offset data unit 530 is connected to the automatic recipe generation system unit 520. The slit uniformity offset data unit 530 subtracts new slit uniformity data 532 from old slit uniformity data 531. An MEF and process offset unit 540, which subtracts new resist and process conditions from old resist and process conditions, is also connected to the automatic recipe generation system unit 520. In addition, a wafer condition offset unit 550, which maintains a zero result for old topography information minus new topography information, is further connected to the automatic recipe generation system unit 520. The automatic recipe generation system unit 520, in turn, is connected to a control unit 560, such as a 29-finger unit. The control unit 560 is connected to an output unit 570, which indicates here that DCD uniformity is improved using this method of dose correction. Moreover, there is no need to take new measurements for recipe setup using this automatic recipe generation system for intra-field dose correction.

Figure 6:
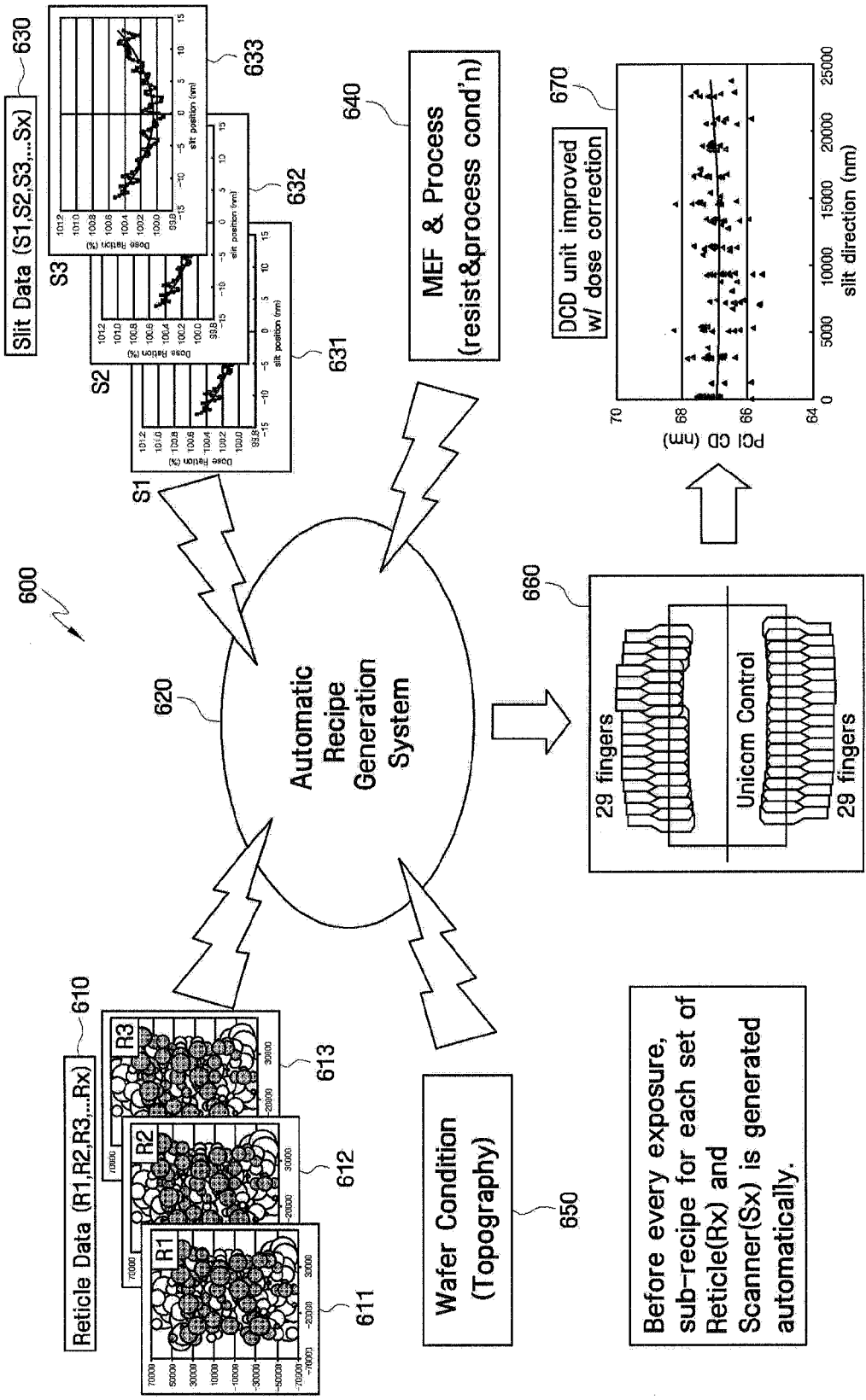
FIG. 6 shows a schematic block diagram of an automatic recipe generation system, adapted for multi-reticle and/or multi-scanner sets, in accordance with an exemplary embodiment of the present disclosure.

Turning now to FIG. 6, an automatic recipe generation system, adapted for multi-reticle and multi-scanner sets, is indicated generally by the reference numeral 600. The system 600 includes a reticle offset data unit 610 with data sets 611, 612 and 613 connected to an automatic recipe generation system unit 620, where the reticle offset data unit subtracts each new reticle data set from the old (e.g., R1, R2, R3 . . . Rx).

A slit uniformity offset data unit 630 with data sets 631, 632 and 633 is connected to the automatic recipe generation system unit 620. The slit uniformity offset data unit 630 subtracts each new slit uniformity data set from the old (e.g., S1, S2, S3 . . . Sx). An MEF and process offset unit 640, which subtracts new resist and process conditions from old resist and process conditions, is also connected to the automatic recipe generation system unit 620. In addition, a wafer condition offset unit 650, which subtracts new topography information from old topography information, is further connected to the automatic recipe generation system unit 620. The automatic recipe generation system unit 620, in turn, is connected to a control unit 660, such as a 29-finger unit. The control unit 660 is connected to an output unit 670, which indicates here that DCD uniformity is improved using this method of dose correction. Thus, before every exposure, a sub-recipe for each set of Reticle data (e.g., Rx) and Scanner data (e.g., Sx) is generated automatically.

These and other features of the present disclosure may be readily ascertained by one of ordinary skill in the pertinent art based on the teachings herein. It is to be understood that the principles of the present disclosure may be implemented in various forms of hardware, software, firmware, special purpose processors, or combinations thereof.

Most preferably, the principles of the present disclosure are implemented as a combination of hardware and software. Moreover, the software is preferably implemented as an application program tangibly embodied in computer-readable storage media. The application program may be uploaded to, and executed by, a machine comprising any suitable architecture. Preferably, the machine is implemented on a computer platform having hardware such as one or more central processing units ("CPU"), a random access memory ("RAM"), and input/output ("I/O") interfaces. The computer platform may also include an operating system and microinstruction code. The various processes and functions described herein may be either part of the microinstruction code or part of the application program, or any combination thereof, which may be executed by a CPU. In addition, various other peripheral units may be connected to the computer platform such as an additional data storage unit, a printing unit, and a photolithography unit.

It is to be further understood that, because some of the constituent system components and methods depicted in the accompanying drawings are preferably implemented in software, the actual connections between the system components or the process function blocks may differ depending upon the manner in which the present invention is programmed. Given the teachings herein, one of ordinary skill in the pertinent art will be able to contemplate these and similar implementations or configurations of the present invention.

Although illustrative embodiments have been described herein with reference to the accompanying drawings, it is to be understood that the present disclosure is not limited to those precise embodiments, and that various other changes and modifications may be effected therein by those of ordinary skill in the pertinent art without departing from the scope or spirit of the present disclosure. All such changes and modifications are intended to be included within the scope of the present disclosure as set forth in the appended claims.

What is claimed is:

1. An automatic dose-correction recipe generation system comprising:
   a memory storing an application program; and
   a central processing unit configured to execute the application program,
   wherein the application program is configured to generate a dose-correction recipe to adjust a dose based on reticle offset information of a mask for a semiconductor and slit uniformity information of a scanner.

2. The system of claim 1 wherein the reticle offset information is derived from subtracting current reticle data of the mask from previous reticle data of the mask.

3. The system of claim 1 wherein the slit uniformity information is derived from subtracting current slit data of the scanner from previous slit data of the scanner.

4. The system of claim 3 wherein the current slit data corresponds to a current condition of a slit of the scanner and the previous slit data corresponds to a previous condition of the slit.

5. The system of claim 1 wherein the recipe is further based on at least one of resist conditions, process conditions, or mask error enhancement factor conditions.

6. The system of claim 1 wherein the recipe is further based on topography information of a wafer of the semiconductor.

7. The system of claim 1 wherein the application program is configured to output a detected critical dimension uniformity.

8. The system of claim 1, wherein the recipe is based on a combination of the reticle offset information and the slit uniformity information.

9. The system of claim 1, wherein the dose is used to compensate for a non-uniformity resulting from mask processes and exposure processes on the scanner.

10. The system of claim 6, wherein the recipe is based on a difference between new topography information of the wafer and old topography information of the wafer.

11. The system of claim 2, further comprising a second application program to derive the reticle offset information by performing the subtracting.

12. The system of claim 3, further comprising a second application program to derive the slit uniformity information by performing the subtracting.

13. An automatic dose-correction recipe generation system comprising:
    a memory storing an application program; and
    a central processing unit configured to execute the application program,
    wherein the application program is configured to generate a dose-correction recipe to adjust a dose based on i) a difference between current reticle data of a mask for a semiconductor from previous reticle data of the mask, ii) a difference between current slit data of a scanner and previous slit data of the scanner, and iii) a difference between current topographical information for a wafer of the semiconductor and previous topographical information of the wafer.

14. The system of claim 13, wherein the dose is used to compensate for a non-uniformity resulting from mask processes and exposure processes on the scanner.

15. The system of claim 14, wherein the application program is configured to output a detected critical dimension uniformity.

* * * * *